(12) United States Patent
Heinen

(10) Patent No.: US 6,369,623 B1
(45) Date of Patent: Apr. 9, 2002

(54) CIRCUIT CONFIGURATION FOR A FREQUENCY DIVIDER

(75) Inventor: Stefan Heinen, Krefeld (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/607,322

(22) Filed: Jun. 30, 2000

(30) Foreign Application Priority Data

Jun. 30, 1999 (DE) .......................... 199 30 168

(51) Int. Cl.$^7$ ............................................. H03K 21/00
(52) U.S. Cl. ............................ 327/117; 377/47; 377/48
(58) Field of Search ............................. 377/47, 48, 49; 327/115, 117, 113

(56) References Cited

U.S. PATENT DOCUMENTS

| | | | | |
|---|---|---|---|---|
| 4,184,068 A | * | 1/1980 | Washburn | 377/44 |
| 6,035,182 A | * | 3/2000 | Shurboff | 327/117 |
| 6,097,782 A | * | 8/2000 | Foroudi | 377/47 |

FOREIGN PATENT DOCUMENTS

| | | |
|---|---|---|
| DE | 40 08 781 A1 | 4/1991 |
| DE | 197 00 017 A1 | 8/1997 |
| DE | 19700017 A1 | 8/1997 |
| EP | 0 171 162 A2 | 2/1986 |
| JP | 2-76414 A | 3/1990 |
| WO | WO 81/02371 | 8/1981 |

OTHER PUBLICATIONS

Philips Semiconductor RF Communications Products: "Divide by:64/65/72 triple modulus low power ECL prescaler –SA702", product specification No. 853–1709 10044, Jun. 17, 1993, pp. 2–8.

* cited by examiner

Primary Examiner—Tuan T. Lam
(74) Attorney, Agent, or Firm—Herbert L. Lerner; Laurence A. Greenberg; Werner H. Stemer

(57) ABSTRACT

A circuit configuration of a frequency divider includes a prescaler with at least two different division ratios and at least two further different division ratios. A main counter connected to an output of the prescaler has an adjustable division ratio. A first lower-level swallow counter has an adjustable division ratio and can change the division ratio of the prescaler. At least one second lower-level swallow counter has an adjustable division ratio, is provided at the output of the main counter and can change the division ratio of the prescaler between the two further division ratios.

11 Claims, 5 Drawing Sheets

Fig. 3

| Count M | Count A2 | Count A1 | State mc2 | State mc1 | Division factor Prescaler $P_{tot}$ | Number of input clock pulses | Output state |
|---|---|---|---|---|---|---|---|
| 15 | 3 | 12 | | | | | |
| 15 | 3 | 12 | 1 | 1 | 81 | 81 | 1 |
| 14 | 2 | 11 | 1 | 1 | 81 | 162 | 0 |
| 13 | 1 | 10 | 1 | 1 | 81 | 243 | 0 |
| 12 | 0 | 9 | 0 | 1 | 65 | 308 | 0 |
| 11 | 0 | 8 | 0 | 1 | 65 | 373 | 0 |
| 10 | 0 | 7 | 0 | 1 | 65 | 438 | 0 |
| 9 | 0 | 6 | 0 | 1 | 65 | 503 | 0 |
| 8 | 0 | 5 | 0 | 1 | 65 | 568 | 0 |
| 7 | 0 | 4 | 0 | 1 | 65 | 633 | 0 |
| 6 | 0 | 3 | 0 | 1 | 65 | 698 | 0 |
| 5 | 0 | 2 | 0 | 1 | 65 | 763 | 0 |
| 4 | 0 | 1 | 0 | 1 | 65 | 828 | 0 |
| 3 | 0 | 0 | 0 | 0 | 64 | 892 | 0 |
| 2 | 0 | 0 | 0 | 0 | 64 | 956 | 0 |
| 1 | 0 | 0 | 0 | 0 | 64 | 1020 | 0 |
| 15 | 3 | 12 | 1 | 1 | 81 | 1101 | 1 |
| 14 | 2 | 11 | 1 | 1 | 81 | 1182 | 0 |
| 13 | 1 | 10 | 1 | 1 | 81 | 1263 | 0 |
| 12 | 0 | 9 | 0 | 1 | 65 | 1328 | 0 |
| 11 | 0 | 8 | 0 | 1 | 65 | 1393 | 0 |
| 10 | 0 | 7 | 0 | 1 | 65 | 1458 | 0 |
| 9 | 0 | 6 | 0 | 1 | 65 | 1523 | 0 |
| 8 | 0 | 5 | 0 | 1 | 65 | 1588 | 0 |
| 7 | 0 | 4 | 0 | 1 | 65 | 1653 | 0 |
| 6 | 0 | 3 | 0 | 1 | 65 | 1718 | 0 |
| 5 | 0 | 2 | 0 | 1 | 65 | 1783 | 0 |
| 4 | 0 | 1 | 0 | 1 | 65 | 1848 | 0 |
| 3 | 0 | 0 | 0 | 0 | 64 | 1912 | 0 |
| 2 | 0 | 0 | 0 | 0 | 64 | 1976 | 0 |
| 1 | 0 | 0 | 0 | 0 | 64 | 2040 | 0 |
| 15 | 3 | 12 | 1 | 1 | 81 | 2121 | 1 |
| 14 | 2 | 11 | 1 | 1 | 81 | 2202 | 0 |
| 13 | 1 | 10 | 1 | 1 | 81 | 2283 | 0 |
| 12 | 0 | 9 | 0 | 1 | 65 | 2348 | 0 |
| 11 | 0 | 8 | 0 | 1 | 65 | 2413 | 0 |
| 10 | 0 | 7 | 0 | 1 | 65 | 2478 | 0 |
| 9 | 0 | 6 | 0 | 1 | 65 | 2543 | 0 |
| 8 | 0 | 5 | 0 | 1 | 65 | 2608 | 0 |
| 7 | 0 | 4 | 0 | 1 | 65 | 2673 | 0 |
| 6 | 0 | 3 | 0 | 1 | 65 | 2738 | 0 |
| 5 | 0 | 2 | 0 | 1 | 65 | 2803 | 0 |
| 4 | 0 | 1 | 0 | 1 | 65 | 2868 | 0 |
| 3 | 0 | 0 | 0 | 0 | 64 | 2932 | 0 |
| 2 | 0 | 0 | 0 | 0 | 64 | 2996 | 0 |
| 1 | 0 | 0 | 0 | 0 | 64 | 3060 | 0 |

Fig. 5

| Count M | Count A2 | Count A1 | State mc2 | State mc1 | Division factor Prescaler $P_{tot}$ | Number of input clock pulses | Output state |
|---|---|---|---|---|---|---|---|
| | 9 | 4 | 7 | | | | |
| | 9 | 4 | 7 | 1 | 1 | 73 | 73 | 1 |
| | 8 | 3 | 6 | 1 | 1 | 73 | 146 | 0 |
| | 7 | 2 | 5 | 1 | 1 | 73 | 219 | 0 |
| | 6 | 1 | 4 | 1 | 1 | 73 | 292 | 0 |
| | 5 | 0 | 3 | 0 | 1 | 65 | 357 | 0 |
| | 4 | 0 | 2 | 0 | 1 | 65 | 422 | 0 |
| | 3 | 0 | 1 | 0 | 1 | 65 | 487 | 0 |
| | 2 | 0 | 0 | 0 | 0 | 64 | 551 | 0 |
| | 1 | 0 | 0 | 0 | 0 | 64 | 615 | 0 |
| | 9 | 4 | 7 | 1 | 1 | 73 | 688 | 1 |
| | 8 | 3 | 6 | 1 | 1 | 73 | 761 | 0 |
| | 7 | 2 | 5 | 1 | 1 | 73 | 834 | 0 |
| | 6 | 1 | 4 | 1 | 1 | 73 | 907 | 0 |
| | 5 | 0 | 3 | 0 | 1 | 65 | 972 | 0 |
| | 4 | 0 | 2 | 0 | 1 | 65 | 1037 | 0 |
| | 3 | 0 | 1 | 0 | 1 | 65 | 1102 | 0 |
| | 2 | 0 | 0 | 0 | 0 | 64 | 1166 | 0 |
| | 1 | 0 | 0 | 0 | 0 | 64 | 1230 | 0 |
| | 9 | 4 | 7 | 1 | 1 | 73 | 1303 | 1 |
| | 8 | 3 | 6 | 1 | 1 | 73 | 1376 | 0 |
| | 7 | 2 | 5 | 1 | 1 | 73 | 1449 | 0 |
| | 6 | 1 | 4 | 1 | 1 | 73 | 1522 | 0 |
| | 5 | 0 | 3 | 0 | 1 | 65 | 1587 | 0 |
| | 4 | 0 | 2 | 0 | 1 | 65 | 1652 | 0 |
| | 3 | 0 | 1 | 0 | 1 | 65 | 1717 | 0 |
| | 2 | 0 | 0 | 0 | 0 | 64 | 1781 | 0 |
| | 1 | 0 | 0 | 0 | 0 | 64 | 1845 | 0 |
| | 9 | 4 | 7 | 1 | 1 | 73 | 1918 | 1 |
| | 8 | 3 | 6 | 1 | 1 | 73 | 1991 | 0 |
| | 7 | 2 | 5 | 1 | 1 | 73 | 2064 | 0 |
| | 6 | 1 | 4 | 1 | 1 | 73 | 2137 | 0 |
| | 5 | 0 | 3 | 0 | 1 | 65 | 2202 | 0 |
| | 4 | 0 | 2 | 0 | 1 | 65 | 2267 | 0 |
| | 3 | 0 | 1 | 0 | 1 | 65 | 2332 | 0 |
| | 2 | 0 | 0 | 0 | 0 | 64 | 2396 | 0 |
| | 1 | 0 | 0 | 0 | 0 | 64 | 2460 | 0 |
| | 9 | 4 | 7 | 1 | 1 | 73 | 2533 | 1 |
| | 8 | 3 | 6 | 1 | 1 | 73 | 2606 | 0 |
| | 7 | 2 | 5 | 1 | 1 | 73 | 2679 | 0 |
| | 6 | 1 | 4 | 1 | 1 | 73 | 2752 | 0 |
| | 5 | 0 | 3 | 0 | 1 | 65 | 2817 | 0 |
| | 4 | 0 | 2 | 0 | 1 | 65 | 2882 | 0 |
| | 3 | 0 | 1 | 0 | 1 | 65 | 2947 | 0 |
| | 2 | 0 | 0 | 0 | 0 | 64 | 3011 | 0 |
| | 1 | 0 | 0 | 0 | 0 | 64 | 3075 | 0 |

CIRCUIT CONFIGURATION FOR A FREQUENCY DIVIDER

BACKGROUND OF THE INVENTION

1. Field of the Invention

The invention relates to a circuit configuration for a frequency divider including a prescaler with at least four different division ratios, a main counter disposed at an output of the prescaler and having an adjustable division ratio, and a lower-level first swallow counter having an adjustable division ratio and being able to change the division ratio of the prescaler.

A similar circuit configuration which is the closest prior art is known from German Published, Non-Prosecuted Patent Application DE 197 00 017 A1. That document describes, in general form, a PLL frequency synthesizer circuit which contains a comparison frequency divider that is equipped with a dual modulus prescaler and a swallow counter. The circuit has a modulus signal output controller which controls the dual modulus prescaler.

One problem with that known circuit configuration is that, when the dual modulus principle is used for a synthesizer, digital broadband radio systems require a low prescaler ratio in order to permit the overall required division ratios to be achieved. However, in a system such as that, small prescaler ratios mean large main divider ratios, which lead to a high main divider operating frequency and thus to high current consumption and poor system characteristics, such as phase noise.

SUMMARY OF THE INVENTION

It is accordingly an object of the invention to provide a circuit configuration for a frequency divider, which overcomes the hereinafore-mentioned disadvantages of the heretofore-known devices of this general type and which manages with a high prescaler ratio and a low main divider ratio in order to achieve a low overall division ratio N.

The invention is based upon the discovery that, in order to achieve a low overall division ratio N with a high prescaler ratio and a low main divider ratio at the same time, it is possible to use a number of swallow counters instead of a single swallow counter. Each swallow counter counts in a multidigit counting system in conjunction with a dual modulus divider and can thus generate a high overall division ratio with low individual division ratios throughout.

With the foregoing and other objects in view there is provided, in accordance with the invention, a circuit configuration for a frequency divider, comprising a prescaler having at least two different division ratios, at least two further different division ratios, and an output; a main counter connected to the output of the prescaler and having an adjustable division ratio and an output; a first lower-level swallow counter for changing the division ratio of the prescaler, the first swallow counter having an adjustable division ratio; and at least one second lower-level swallow counter for changing a division ratio of the prescaler between the two further division ratios, the at least one second lower-level swallow counter connected to the output of the main counter and having an adjustable division ratio.

In accordance with another feature of the invention, the prescaler has two dual modulus dividers which can both be changed through the swallow counters at least between division ratios $K_1$ and $K_1+1$ as well as $K_2$ and $K_2+1$, a first changeover input for changing the division ratio $K_1$ of the first dual modulus divider to $K_1+1$, a second input for changing the division ratio $K_2$ of the second dual modulus divider to $K_2+1$, and an additional circuit is provided between the two dual modulus dividers resulting in the first dual modulus divider being changed to a higher division ratio $K_1+1$ only once within one counting run of the second dual modulus divider.

As a rule, the division ratios K1 and K2 are numbers which are calculated as powers to base 2, where $K1=2^{P1}$ and $K2=2^{P2}$. The overall division ratio of the prescaler (prescaler division ratio) $P_{tot}$ is given by:

$$P_{tot}=2^{P2} * 2^{P1}+2^{P1}*mc_1+mc_2,$$

where P1 is the exponent of 2 for the division ratio of the first dual modulus divider, P2 is the exponent of 2 for the division ratio of the second dual modulus divider and mc2 and mc1 are the values 0 or 1 of the changeover inputs (mc) of the respective dual modulus divider. In the case of the exponents P2 and P1, it is advantageous for $P2 \leq P1$ and, preferably, for $2^{P1}=2^{P2}$. Thus, the variation of the values mc0 and mc1 gives the following possible prescaler division ratios:

$$P_{tot}=2^{(P2+P1)}+2^{P1}*0+0,$$

$$P_{tot}=2^{(P2+P1)}+2^{P1}*0+1,$$

$$P_{tot}=2^{(P2+P1)}+2^{P1}*1+0,$$

and $$P_{tot}=2^{(P2+P1)}+2^{P1}*1+1.$$

Thus, for example, if a 16/17 divider is used as the first dual modulus divider and a 4/5 divider is used as the second dual modulus divider, this results in the following possible prescaler division ratios for the quadro modulus divider:

$$P_{tot}=2^{(2+4)}+2^{4}*0+0=64,$$

$$P_{tot}=2^{(2+4)}+2^{4}*0+1=65,$$

$$P_{tot}=2^{(2+4)}+2^{4}*1+0=80,$$

and $$P_{tot}=2^{(2+4)}+2^{4}*1+1=81.$$

In accordance with a further feature of the invention, the main counter can be configured in such a way that, once M preset pulses have been input, it emits an output pulse and automatically resets itself to a predetermined initial value once again.

In accordance with an added feature of the invention, the input of the first adjustable swallow counter can be connected to the output of the prescaler, and the output of the swallow counter can be connected to the lower value changeover input of the quadro modulus prescaler (=changeover input of the first dual modulus divider), with the loading pulse of the main counter also resetting the first swallow counter. Furthermore, the input of the second adjustable swallow counter can be connected to the output of the prescaler, and the output of the second swallow counter can be connected to the higher value changeover input of the quadro modulus prescaler (=changeover input of the second dual modulus divider), with the loading pulse of the main counter also resetting the second swallow counter.

This circuit configuration results in an overall division ratio N for the overall circuit configuration of $N=(K_1*K_2)*M+K_2*A2+A1$. Through skilful selection of the individual division ratios, a division ratio which is high overall can easily be achieved by using intrinsically small individual division ratios. In principle, this type of division process corresponds to the notation for a large number in a numerical system with small base numbers by the use of a number of "digits". In this case, however, due to the circuit configuration, all of the overall division ratios can only be defined in steps of 1 from a specific value $N_1$.

In accordance with an additional feature of the invention, the first dual modulus divider is a 16/17 divider, the second dual modulus divider is a 4/5 divider, and the two form a quadro modulus prescaler with division ratios 64/65/80/81. This results in an overall division ratio of $N=64*M+16*A2+A1$. All of the integer overall division ratios $N \geq 960$ from $M \geq 15$ can be selected by using $0 \leq A1, A2 \leq M$, without any gaps, by variation of the M, A1 and A2 values.

In accordance with yet another feature of the invention, the first and the second dual modulus dividers are each an 8/9 divider, and the two form a quadro modulus prescaler with division ratios 64/65/72/73.

In accordance with yet a further feature of the invention, the first and the second dual modulus divider are each a 16/17 divider, and the two form a quadro modulus prescaler with division ratios 256/257/272/273.

In accordance with yet an added feature of the invention, the division ratio $K_1$ of the first dual modulus divider is equal to the division ratio $K_2$ of the second dual modulus divider. This avoids redundancies in the numbering of the divider.

In accordance with yet an additional feature of the invention, in order to provide a particularly low overall division ratio N with prescaler ratios that are as high as possible, the prescaler has other interconnected dual modulus dividers and further swallow counters are provided, with each of the dual modulus dividers being assigned a swallow counter and with there being an additional circuit between the dual modulus dividers which results in the other dual modulus dividers being changed to the higher division ratio only once within a counting run of the further dual modulus divider. In this way, by using a "multidigit" overall divider, a corresponding high overall division ratio N can be achieved through the use of a small number of low-value dual modulus dividers.

In accordance with a concomitant feature of the invention, the circuit configurations can be included as frequency dividers in a phased locked loop (PLL) circuit. This PLL circuit according to the invention can then be used in a particularly preferred manner in a mobile radio system, resulting in considerable current savings in comparison with the prior art, as a result of which, in turn, the current sources (rechargeable batteries) which are used can also be reduced in size without reducing the available operating time.

It is self-evident that the features of the invention which are mentioned above and which will be explained in more detail in the following text can be used not only in the respective described combination but also in other combinations or on their own without departing from the scope of the invention.

Other features which are considered as characteristic for the invention are set forth in the appended claims.

Although the invention is illustrated and described herein as embodied in a circuit configuration for a frequency divider, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a table showing an example of a counting process with 16/17 and 4/5 divider;

FIG. 5 is a table showing an example of a counting process with two 8/9 dividers.

DESCRIPTION OF THE PREFERRED EMBODIMENTS

Figure 1:
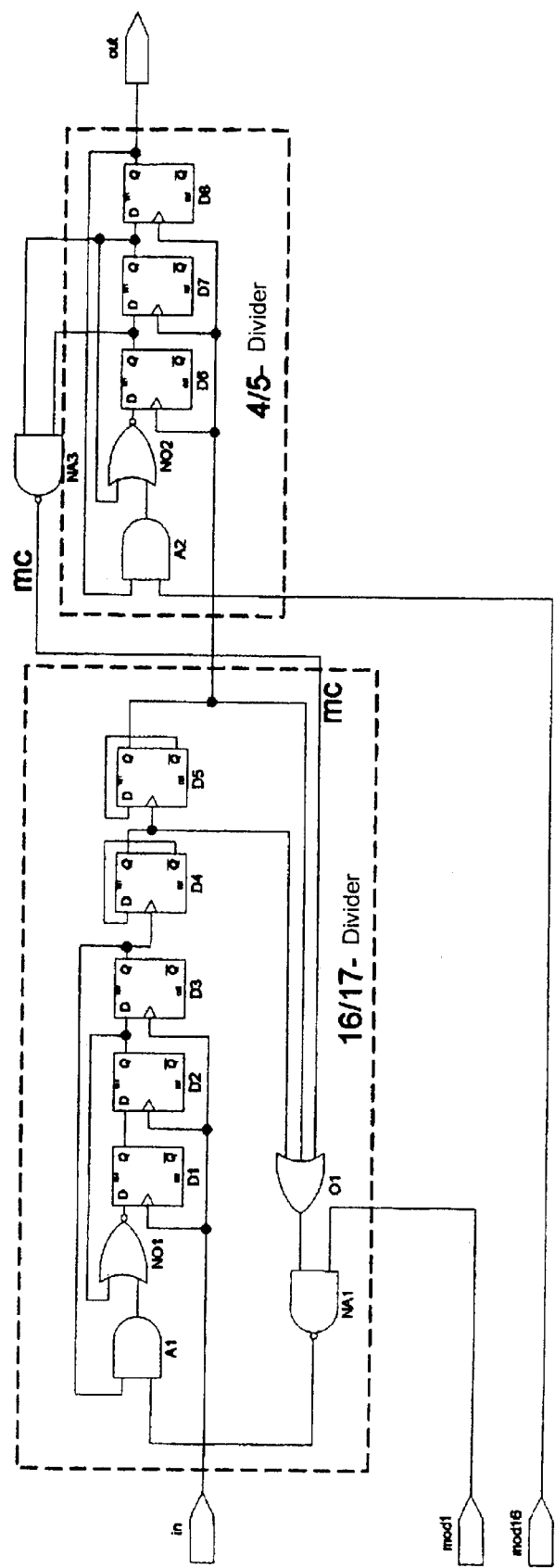
FIG. 1 is a schematic and block circuit diagram of a quadro modulus prescaler 64/65/80/81.

Referring now to the figures of the drawings in detail and first, particularly, to FIG. 1 thereof, there is seen an example of a quadro modulus prescaler, as can be used in a circuit according to the invention. The quadro modulus prescaler includes first and second cascaded dual modulus dividers. The first divider is a standard 16/17 divider that is equipped with an additional control input for a control signal MC which can cause a division ratio of 17 to be locked. An output of the first prescaler is connected to an input of the second dual modulus divider, which is a 4/5 divider. The second dual modulus divider uses a NAND gate NA3 to generate the control signal MC from internal signals. The control signal MC allows the first divider to be changed during an overall counting period to the 17 mode once, and only once, in the entire period. Changing the second divider from the division ratio of 4 to the division ratio of 5 thus increases the overall division ratio of the illustrated quadro modulus prescaler by 16, which is done independently of the status of the first divider.

The illustrated circuit of two cascaded dual modulus dividers thus allows a quadro modulus divider to be provided which has an adjustable division ratio of 64, 65, 80 or 81.

Figure 2:
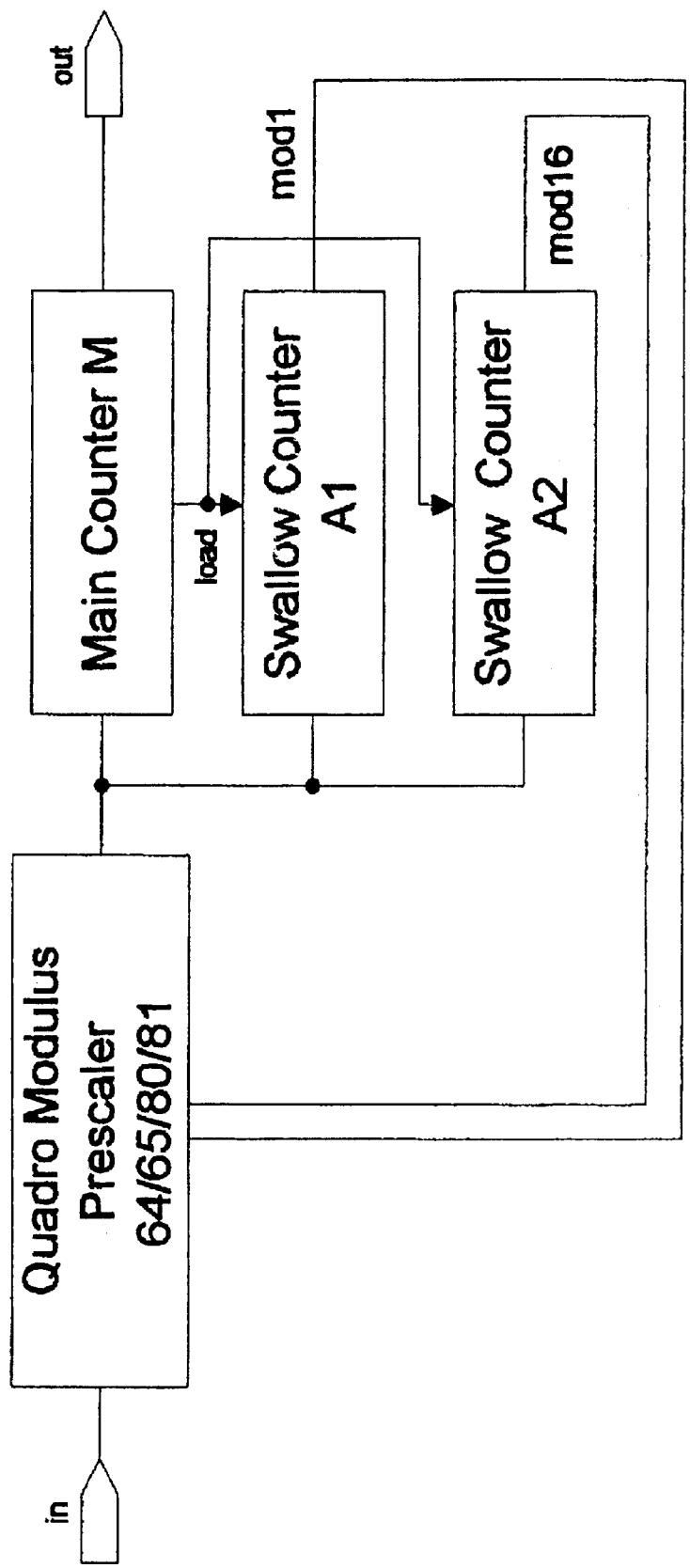
FIG. 2 is a block circuit diagram of a frequency counter according to the invention.

The quadro modulus prescaler described with regard to FIG. 1 may be connected to a main counter and two swallow counters in a manner shown in FIG. 2, with each swallow counter being capable of changing a dual modulus prescaler from one division mode to a further division mode. Then, beyond a specific main counter M division ratio, any overall division ratio N can be achieved without any gaps, by sensible adjustment of the division ratios of the main counter and of the two swallow counters.

The overall circuit configuration produces an overall division ratio N with $N=64*M+16*A2+A1$ where A1, $A2 \leq M$, depending on settings of a division ratio of a main counter M, a division ratio of a first swallow counter A1 and a division ratio of a second swallow counter A2. Thus, in this case, any overall division ratio greater than or equal to 960 can be generated in steps of 1 from a value of M=15 or N=960.

If, on the other hand, one considers the known dual modulus principle, then, for a 64/65 prescaler, any overall division ratio could be set only from a main division ratio of N=4032, corresponding to M=64−1. The circuit configuration according to the invention thus means that a lower main division ratio M is necessary for the same maximum prescaler ratio size in order to be able to vary the overall division ratio in steps of 1.

FIG. 3 uses a table to show a counting status of the circuit configuration according to the invention as seen in FIG. 2, with a counter as shown in FIG. 1.

Line 2, in bold text, shows initial values for the individual dividers. The start of counting, that is to say the overall period, starts with the next line in which the set initial values from the line in bold text are present at all of the counters.

A first column of the table shows the counts of the main counter M and second and third columns respectively show the counts of the swallow counters A2 and A1. Fourth and fifth columns respectively show the states of modulus control inputs mc2 and mc1 of the second and first dual modulus dividers. The sixth column shows the division ratio of the prescaler used for each line, while the next-to-the-last column shows the total number of input pulses. Finally, the last column shows the state of the output of the counter circuit according to the invention.

Figure 4:
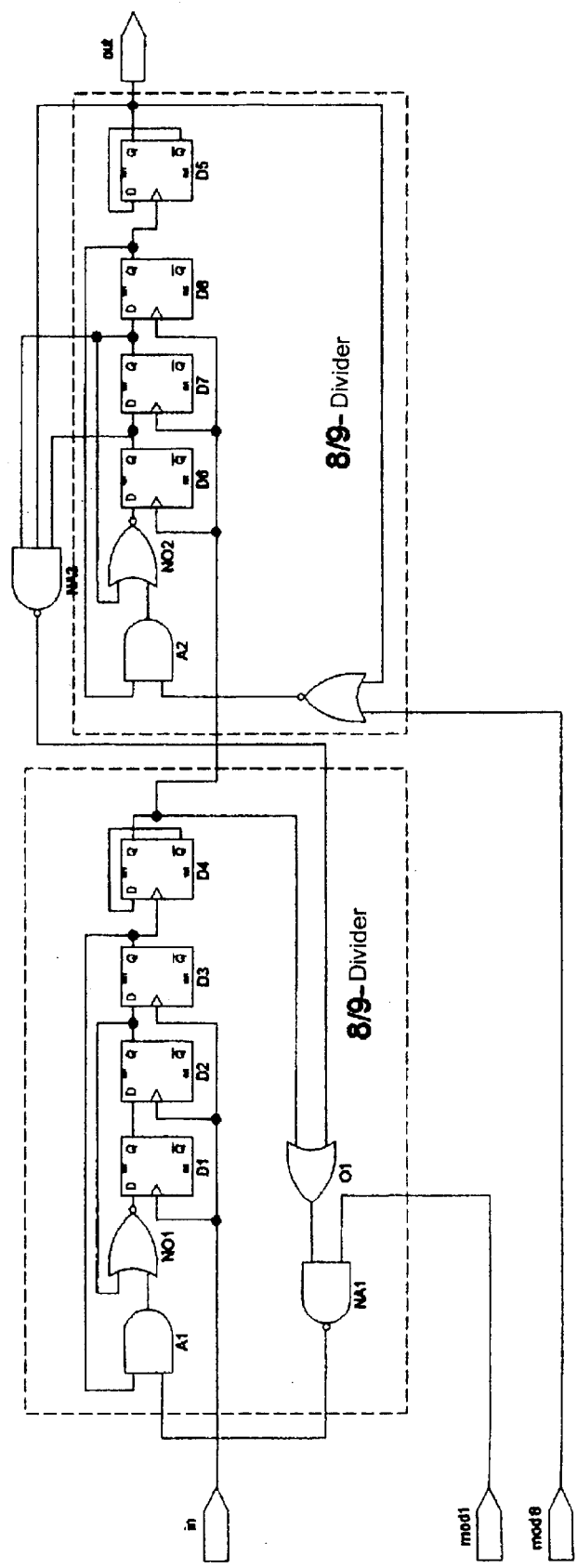
FIG. 4 is a view similar to FIG. 1 of a quadro modulus prescaler 64/65/72/73.

FIG. 4 shows a further variant of a quadro modulus prescaler with division ratios of 64/65/72/73, which is formed from two cascaded 8/9 dividers. The selection of these dividers means that the overall division ratio is calculated to be: $M=64*M+8*A2+A1$ where A, $A2 \leq M$. In consequence, this makes it possible to generate any division ratios without any gaps from $M \geq 7$ and $N \geq 448$.

An illustration of the counter response corresponding to the table in FIG. 3, is shown in FIG. 5 for the prescaler of FIG. 4. In this illustration, the preset values of the main counter are M=9, that of the first swallow counter is A1=7 and that of the second swallow counter is A2=4, with two cascaded 8/9 dividers being used. On the basis of the preset values, this results in an overall division ratio of N=615, and the circuit emits an output pulse for every 615 input pulses.

The circuit configuration according to the invention thus provides a frequency divider which manages to achieve a low overall division ratio N, with a high prescaler ratio and a low main division ratio.

I claim:

1. A circuit configuration for a frequency divider, comprising:
   a prescaler having at least two different division ratios, at least two further different division ratios, and an output;
   a main counter connected to said output of said prescaler and having an adjustable division ratio and an output;
   a first lower-level swallow counter, coupled to said output of said main counter, for changing said division ratio of said prescaler, said first swallow counter having an adjustable division ratio; and
   at least one second lower-level swallow counter for changing a division ratio of said prescaler between said two further division ratios, said at least one second lower-level swallow counter connected to said output of said main counter and having an adjustable division ratio.

2. The circuit configuration according to claim 1, wherein said prescaler includes first and second dual modulus dividers both to be changed by said swallow counters at least between division ratios $K_1$ and $K_1+1$ as well as $K_2$ and $K_2+1$, said prescaler has a first changeover input for changing said division ratio $K_1$ of said first dual modulus divider to $K_1+1$ and a second input for changing said division ratio $K_2$ of said second dual modulus divider to $K_2+1$, and an additional circuit between said two dual modulus dividers resulting in said first dual modulus divider changing to said higher division ratio $K_1+1$ only once within one counting run of said second dual modulus divider.

3. The circuit configuration according to claim 1, wherein said main counter emits an output pulse and a loading pulse and is thus reset to an initial value again, once preselected pulses have been input.

4. The circuit configuration according to claim 3, wherein said first swallow counter has an input connected to said output of said prescaler and an output connected to said first changeover input of said first dual modulus divider, and said first swallow counter is reset by said loading pulse at the output of said main counter.

5. The circuit configuration according to claim 3, wherein said second adjustable swallow counter has an input connected to said output of said prescaler and an output connected to said first changeover input of said second dual modulus divider, and said second swallow counter is reset by said loading pulse at the output of said main counter.

6. The circuit configuration according to claim 2, wherein said first dual modulus divider is a 16/17 divider, said second dual modulus divider is a 4/5 divider, and said prescaler is a quadro modulus prescaler formed by said two dual modulus dividers and having division ratios 64/65/80/81.

7. The circuit configuration according to claim 2, wherein said first and second dual modulus dividers are each an 8/9 divider, and said prescaler is a quadro modulus prescaler formed by said two dual modulus dividers and having division ratios 64/65/72/73.

8. The circuit configuration according to claim 2, wherein said first and second dual modulus dividers are each a 16/17 divider, and said prescaler is a quadro modulus prescaler formed by said two dual modulus dividers and having division ratios 256/257/272/273.

9. The circuit configuration according to claim 2, wherein said division ratio $K_1$ corresponds to the square of said division ratio $K_2$.

10. A phased locked loop circuit, comprising the circuit configuration according to claim 1 as a frequency divider.

11. A mobile radio system, comprising the circuit configuration according to claim 1 for forming a reference frequency.

* * * * *